(12) United States Patent
Horii et al.

(10) Patent No.: US 6,812,510 B2
(45) Date of Patent: Nov. 2, 2004

(54) FERROELECTRIC CAPACITOR, PROCESS FOR MANUFACTURING THEREOF AND FERROELECTRIC MEMORY

(75) Inventors: Yoshimasa Horii, Kawasaki (JP); Osamu Matsuura, Kawasaki (JP); Katsuyoshi Matsuura, Kawaskai (JP); Kazuaki Takai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/369,720

(22) Filed: Feb. 21, 2003

(65) Prior Publication Data

US 2003/0230773 A1 Dec. 18, 2003

(30) Foreign Application Priority Data

Jun. 14, 2002 (JP) .......................... 2002-173777

(51) Int. Cl.⁷ .............................................. H01L 29/76
(52) U.S. Cl. .......................... 257/295; 257/68; 257/71; 257/296; 257/324; 438/3; 438/240
(58) Field of Search .................... 257/68, 71, 395–314, 257/324–326; 438/3, 240

(56) References Cited

U.S. PATENT DOCUMENTS

| | | | | |
|---|---|---|---|---|
| 5,661,115 A | * | 8/1997 | Sandhu | 427/534 |
| 6,229,166 B1 | * | 5/2001 | Kim et al. | 257/295 |
| 6,306,666 B1 | * | 10/2001 | Cho | 483/3 |
| 6,465,348 B1 | * | 10/2002 | Wang | 438/681 |
| 2002/0098645 A1 | * | 7/2002 | Jung et al. | 438/253 |
| 2002/0106818 A1 | * | 8/2002 | Adachi et al. | 438/14 |

FOREIGN PATENT DOCUMENTS

| | | |
|---|---|---|
| JP | 6-68529 | 3/1994 |
| JP | 6-280023 | 10/1994 |
| JP | 2000-232102 | 8/2000 |
| JP | 2001-284549 | 10/2001 |

* cited by examiner

*Primary Examiner*—David Nelms
*Assistant Examiner*—Andy Huynh
(74) *Attorney, Agent, or Firm*—Westerman, Hattori, Daniels & Adrian, LLP

(57) ABSTRACT

A ferroelectric capacitor having a ferroelectric layer and a pair of electrodes, in which the ferroelectric layer contains carbon or carbon atoms of $5\times10^{18}$ cm$^{-3}$ or less, and the pair of electrodes is formed by a MOCVD (Metal Organic Chemical Vapor Deposition) method. A process for manufacturing a ferroelectric capacitor having the steps of forming a ferroelectric layer on one of a pair of electrodes; heating the layer at a temperature higher than when forming the layer, and to form the other electrode on the ferroelectric layer, or the steps of forming a ferroelectric layer on one of a pair of electrodes; forming the other electrode on the ferroelectric layer; and heating the layer at a temperature higher than when forming the layer to form the other electrode on the ferroelectric layer, to control carbon atoms of the ferroelectric layer to be $5\times10^{18}$ cm$^{-3}$ or less.

11 Claims, 6 Drawing Sheets

FERROELECTRIC CAPACITOR, PROCESS FOR MANUFACTURING THEREOF AND FERROELECTRIC MEMORY

CROSS-REFERENCE TO RELATED APPLICATIONS

This application is based upon and claims the benefit of priority from the prior Japanese Patent Application No. 2002-173777, filed on Jun. 14, 2002, the entire contents of which are incorporated herein by reference.

BACKGROUND OF THE INVENTION

1. Field of the Invention

The present invention relates to a ferroelectric capacitor having a crystalline thin-film of complex oxide formed by an MOCVD (Metal Organic Chemical Vapor Deposition) method and a method for producing thereof, and a ferroelectric memory comprising the ferroelectric capacitor.

2. Description of the Related Art

Conventionally, the structure of ferroelectric capacitors has been a planar-type. However, it is switching over to stack-type as capacitor integrity increases. A ferroelectric layer in a ferroelectric capacitor should be excellent in step coverage for realization of stereoscopic structure of the capacitor and should be high-density crystals for high ferroelectricity upon micronization of the capacitor. Therefore, the ferroelectric layer is conventionally formed not by the sol.gel method or sputtering method, but by the MOCVD method. Specifically, a ferroelectric layer formed of PZT is formed on one of a pair of electrodes of a noble metal such as Pt, Ir and the like or an electrically conductive oxide such as IrOx and the like by the MOCVD method and the other electrode is formed on the ferroelectric layer.

However, when the ferroelectric layer is formed of PZT by an MOCVD method, Pb in the ferroelectric layer of PZT may react with Pt of the one of a pair of electrodes material, whereby $Ptpb_x$ is formed and the surface becomes coarse. Therefore, Pt cannot be used as a material for one of a pair of electrodes. In addition, electrically conductive oxides such as IrOx commonly used as a material for one of a pair of electrodes cannot be used since they may be reduced during the formation of the PZT layer.

For these reasons, recently, Ir is used as a material for one of a pair of electrodes when forming a ferroelectric layer comprising PZT by the MOCVD method. An organic metal as a raw material is mixed with an oxidizing gas and is sprayed onto a wafer heated to 400° C. to 700° C., whereby the organic metal is thermally decomposed to form a ferroelectric layer comprising PZT on the one of a pair of electrodes comprising Ir. Then, the other electrode layer is formed by comprising $IrO_x$ on the ferroelectric layer comprising PZT in order to form a ferroelectric capacitor.

However, the ferroelectric capacitor thus obtained has problems of being inferior in fatigue properties and imprint properties. Therefore, there are needed a high-quality ferroelectric capacitor without such problems and an effective method for manufacturing a ferroelectric capacitor.

SUMMARY OF THE INVENTION

An object of the present invention is to provide a high-quality ferroelectric capacitor which is excellent in fatigue properties and imprint properties and an effective method for manufacturing it, and a high-quality ferroelectric memory comprising the ferroelectric capacitor. A ferroelectric capacitor according to the present invention comprises a ferroelectric layer formed by a MOCVD (Metal Organic Chemical Vapor Deposition) method, and a pair of electrodes contacting with the ferroelectric layer, wherein the ferroelectric layer has one of carbon and carbon atoms of $5 \times 10^{18}$ cm$^{-3}$ or less.

Since the amount of carbon atoms in the ferroelectric layer is small, the ferroelectric capacitor is excellent in fatigue properties and imprint properties.

A ferroelectric memory according to the present invention comprises a ferroelectric capacitor according to the present invention. Since the amount of carbon atoms in the ferroelectric layer is small, this memory is excellent in fatigue properties and imprint properties.

The first aspect of a process for manufacturing a ferroelectric capacitor comprises the steps of: forming a ferroelectric layer on one of a pair of electrodes; heating the ferroelectric layer at a temperature higher than a temperature for forming the ferroelectric layer to control carbon atoms of the ferroelectric layer to be $5 \times 10^{18}$ cm$^{-3}$ or less, and forming the other electrode on the ferroelectric layer. According to this process, carbon and hydrogen in the ferroelectric layer after forming a ferroelectric layer are released in vapor phase by the heating of a ferroelectric capacitor at a temperature higher than the temperature at which the ferroelectric layer is formed. As a result, the amounts of carbon and hydrogen existing in the ferroelectric layer are reduced, whereby fatigue properties and imprint properties of the ferroelectric capacitor are improved.

The second aspect of a process for manufacturing a ferroelectric capacitor comprises the steps of forming a ferroelectric layer on one of a pair of electrodes; forming the other electrode on the ferroelectric layer; heating the ferroelectric layer at a temperature higher than a temperature for forming the ferroelectric layer to control carbon atoms of the ferroelectric layer to be $5 \times 10^{18}$ cm$^{-3}$ or less, and forming the other electrode on the ferroelectric layer. According to this process, carbon and hydrogen in the ferroelectric layer after forming a ferroelectric layer are released in vapor phase by the step of heating a ferroelectric layer at a temperature higher than the temperature at which the ferroelectric layer is formed. As a result, the amounts of carbon and hydrogen existing in the ferroelectric layer are reduced, whereby fatigue properties and imprint properties of the ferroelectric capacitor are improved.

The present invention is based on the following observation. In forming a ferroelectric layer comprising PZT by the MOCVD method, Pb(DPM) Zr(DPM)$_2$, Zr(DPM)$_4$, and Ti(iPro)$_2$(DPM)$_2$ are used as raw materials. In the ideal MOCVD method, a bonding between a metal and a precursor is broken near one of a pair of electrodes (the surface of a substrate) and only the metal part is introduced to a ferroelectric layer. However, in practice, the precursor part containing a large amount of carbon and hydrogen may be introduced to the ferroelectric layer, whereby the concentration of impurity in the ferroelectric layer increases. When the ferroelectric layer contains a large amount of impurities, fatigue properties in the ferroelectric memory comprising the ferroelectric layer at the time of repeated rewriting operations tend to deteriorate, and imprint properties at the time of long period data storage also tend to deteriorate. For example, the measurement by the SIMS (secondary electron spectrometry method) results in a hydrogen content of $5 \times 10^{21}$ atoms/cm$^3$, carbon of $2 \times 10^{19}$ atoms/cm$^3$. When a ferroelectric is inversed repeatedly at the inversion times of $1 \times 10^7$, ferroelectric properties deteriorate (reduction in charge). Consequently, it is observed that when the concentration of hydrogen and carbon are high, the ferroelectric capacitor does not operate at satisfying level.

DESCRIPTION OF THE PREFERRED EMBODIMENTS

According to the present invention, a ferroelectric capacitor comprises a ferroelectric layer formed by a MOCVD (Metal Organic Chemical Vapor Deposition) method, and a pair of electrodes contacting with the ferroelectric layer, wherein the ferroelectric layer has one of carbon and carbon atoms of $5 \times 10^{18}$ cm$^{-3}$ or less.

The pair of electrodes is not particularly limited, and may be suitably selected according to the purposes. Examples of the electrodes include one of a pair of electrodes formed on a surface of one of the electrodes, and the other electrode formed on a surface of the other electrode.

A ferroelectric capacitor according to the present invention may be suitably manufactured by a method for manufacturing the ferroelectric capacitor according to the present invention.

Now, the ferroelectric capacitor according to the present invention will be precisely described by the following explanation of a method for manufacturing the ferroelectric capacitor according to the present invention.

A process for manufacturing the ferroelectric capacitor according to the present invention may include the first aspect and the second aspect, as follows.

In the first aspect, a ferroelectric layer is formed on one of a pair of electrodes. The ferroelectric layer is subjected to a heat treatment at a temperature which is higher than the temperature at which the ferroelectric layer has been formed so as to have carbon atoms of $5 \times 10^{18}$ cm$^{-3}$ or less in the ferroelectric layer. the other electrode is formed on the ferroelectric layer.

In the second aspect, a ferroelectric layer is formed on one of a pair of electrodes and the other electrode is formed on the ferroelectric layer. The resulting structure is subjected to a heat treatment at a temperature which is higher than the temperature at which the ferroelectric layer has been formed so that a content of carbon atoms in the ferroelectric layer $5 \times 10^{18}$ cm$^{-3}$ or less.

Material for the one of a pair of electrodes is not particularly limited as long as it contains Ir and can be suitably selected according to the intended purpose. For example, examples include a single-layer structure of Ir, or a multi-layer structure where a layer comprising Ir is laminated on a substrate such as Ti, Si and the like. However, in terms of improving an orientation of the ferroelectric layer (for example a PZT layer), the multi-layer structure is preferred. Specific examples of the multi-layer structure include Ir/Ti (Ir 150 nm/Ti 10 nm) and the like.

The thickness of the Ir layer of the single-layer structure or the thickness of the Ir layer in the multi-layer structure is not particularly limited and can be suitably selected according to the intended purpose. For example, about 10 nm to 1000 nm is preferred and 50 nm to 500 nm is more preferred.

A process for forming the one of a pair of electrodes is not particularly limited and can be suitably selected according to the intended purpose. Suitable examples of a method for forming one of a pair of electrodes include a sputtering method, and the like.

The conditions for forming the one of a pair of the electrodes are not particularly limited and can be suitably selected according to the intended purpose.

The ferroelectric layer is formed on the one of a pair of the electrodes by the MOCVD method.

However, the composition of the ferroelectric layer is not particularly limited and can be suitably selected according to the intended purpose. PZT, which is, Pb(Zr$_x$, Ti$_{1-x}$)O$_3$ (0<x ≤1) is preferred since it can be formed at a lower temperature than other compositions (SBT; SrBiTa$_2$O$_9$, and the like). In addition, it is preferred in terms of a temperature in the process for forming a bulk transistor.

The structure of the ferroelectric layer is not particularly limited and can be suitably selected according to the intended purpose. It can be a single-layer structure or a multi-layer structure.

The thickness of the ferroelectric layer is not particularly limited and can be suitably selected according to the intended purpose. For example, it is preferably about 10 nm to 1000 nm, and more preferably 50 nm to 500 nm.

Material gases and reaction conditions for forming the ferroelectric layer by the MOCVD method vary according to the types of the ferroelectric to be formed, and cannot be predetermined as a whole. For example, when the ferroelectric layer is a PZT layer, Pb raw gas, Zr raw gas and Ti raw gas are used as raw gases.

Examples of the Pb material gas may include for example, $Pb(DPM)_2$ and the like. Examples of the Zr material gas may include for example, $Zr(dmhd)_4$ and the like. Examples of the Ti material gas may include for example, $Ti(O-iPr)_2$ $(DPM)_2$ and the like.

The Pb material gas is injected at a flow rate of about 0.01 ml/min to 1.0 ml/min, preferably 0.1 ml/min to 0.5 ml/min. The Zr material gas is injected at a flow rate of about 0.01 ml/min to 1.0 ml/min, preferably 0.1 ml/min to 0.5 ml/min. The Ti material gas is injected at a flow rate of about 0.01 ml/min to 1.0 ml/min, preferably 0.1 ml/min to 0.5 ml/min.

The oxygen partial pressure in raw material gases is not particularly limited and can be suitably selected according to the intended purpose. For example, it is about 1 Torr to 10 Torr (133 Pa to 1333 Pa), preferably 3 Torr to 7 Torr (399 Pa to 933 Pa).

In addition, a method for preparing the raw material gases is not particularly limited and can be suitably selected according to the intended purpose. For example, it includes a method in which materials for the raw material gases are dissolved in a solvent such as THF and the like to form a solution, and the solution is then evaporated.

The evaporation can be carried out, using any known evaporator.

The evaporated raw material gases are then mixed with oxygen gas to a predetermined oxygen partial pressure and sprayed onto the one of a pair of the electrodes by a shower head and the like. In this way, the ferroelectric layer can be formed.

Conditions for the above reaction are not particularly limited and can be suitably selected according to the intended purpose. For example, the reaction temperature for forming a PZT layer is about 580° C. to 620° C., although it varies according to the types of the ferroelectric to be formed and cannot be prescribed in a way.

the other electrode is formed on the ferroelectric layer by the sputtering method.

Conditions for forming the other electrode by the sputtering method are not particularly limited and can be suitably selected according to the intended purpose.

Materials for the other electrode are not particularly limited as long as it comprises one of Ir and Ir oxide and can be suitably selected according to the intended purpose. For example, it includes either a single-layer structure comprising one of Ir and Ir oxide, or a multi-layer structure of a layer comprising one of Ir and Ir oxide laminated on a substrate of SRO and the like.

Examples of suitable material for the other electrode include iridium oxide.

The thickness of the layer comprising at least one of Ir and Ir oxide in the single-layer structure or the thickness of the layer comprising at least one of Ir and Ir oxide in the multi-layer structure is not particularly limited and can be suitably selected according to the intended purpose. For example, about 10 nm to 1000 nm is preferred and 50 nm to 500 nm is more preferred.

According to the present invention, after the one of a pair of electrodes is formed and the ferroelectric layer is formed on the one of a pair of electrodes, the ferroelectric layer should be subjected to a heat treatment (the heat treatment of the first aspect). Alternatively, after the one of a pair of electrodes is formed, the ferroelectric layer is formed on the one of a pair of electrodes and the other electrode is formed on the ferroelectric layer to form a ferroelectric capacitor, the ferroelectric capacitor as a whole should be subjected to a heat treatment (the heat treatment of the second aspect).

In addition, for the heat treatment according to the second aspect, after only the other electrode is etched, the heat treatment is carried out. In this case, it is expected that when the area of the ferroelectric capacitor is decreased, the effect of the surrounding field is evident.

Suitable conditions for the heat treatment include, for example, a low pressure RTA (Rapid Thermal Anneal) and a atmospheric pressure RTA (Rapid Thermal Anneal).

For the low pressure RTA (Rapid Thermal Anneal), the temperature of forming a layer is preferably adjusted to a temperature 30° C. to 100° C. higher, more preferably 40° C. to 100° C. higher, still preferably 50° C. to 90° C. higher, and still preferably 60° C. to 80° C. higher, than the temperature at which the ferroelectric layer has been formed.

Suitable conditions for the low pressure RTA (Rapid Thermal Anneal) include, for example, a pressure of 0.1 Torr to 10 Torr (13.3 Pa to 1333 Pa).

For the atmospheric pressure RTA (Rapid thermal anneal), the temperature of forming a layer is preferably adjusted to a temperature which is 40° C. to 160° C. higher, more preferably 70° C. to 160° C. higher, and still more preferably 80° C. to 120° C. higher, than the temperature at which the ferroelectric layer has been formed.

By the heat treatment, the carbon atoms in the ferroelectric layer can be adjusted to $5 \times 10^{18} cm^{-3}$ or less and the hydrogen concentration in the ferroelectric layer can be adjusted to $3 \times 10^{21}$ $cm^{-3}$ or less.

Also, the carbon atoms in the ferroelectric layer can be measured, for example, by SIMS (secondary electron spectrometry method). The hydrogen concentration of the ferroelectric layer can be measured, for example, by SIMS (secondary electron spectrometry method).

Thereby, a ferroelectric capacitor according to the present invention is formed. The structure of the ferroelectric capacitor is not particularly limited and can be suitably selected according to the intended purpose. For example, it may be any one of planar type and stack type. For the stack type, it may be flat shaped or 3-dimensional shaped structure.

The ferroelectric capacitor may be used in various fields but is particularly suitable for use in a ferroelectric memory according to the present invention.

A ferroelectric memory according to the present invention is not particularly limited except for inclusion of the ferroelectric capacitor according to the present invention and may have any known construction.

An embodiment of the ferroelectric memory is not particularly limited and can be suitably selected according to the intended purpose. An example includes FRAM (Ferroelectric Random Access Memory), and the like.

Now, a FRAM (Ferroelectric Random Access Memory) comprising the ferroelectric capacitor according to the present invention will be explained along with the process for manufacturing the same.

Figure 1:
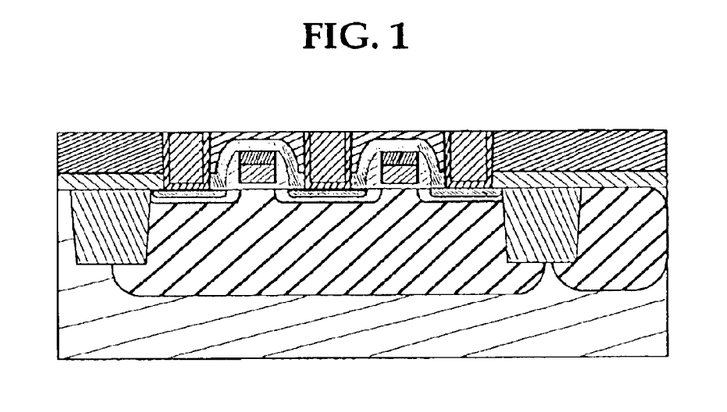
FIG. 1 is a schematic explanatory view of a process for manufacturing a ferroelectric memory according to the present invention, showing an example of a state before forming a ferroelectric capacitor according to the present invention.

As shown in FIG. 1, after the transistor part is constructed, a plug contact part is opened and Ti, TiN and W are laminated in this order. The laminated W/TiN/Ti is subjected to the CMP to form a plug.

Figure 2:
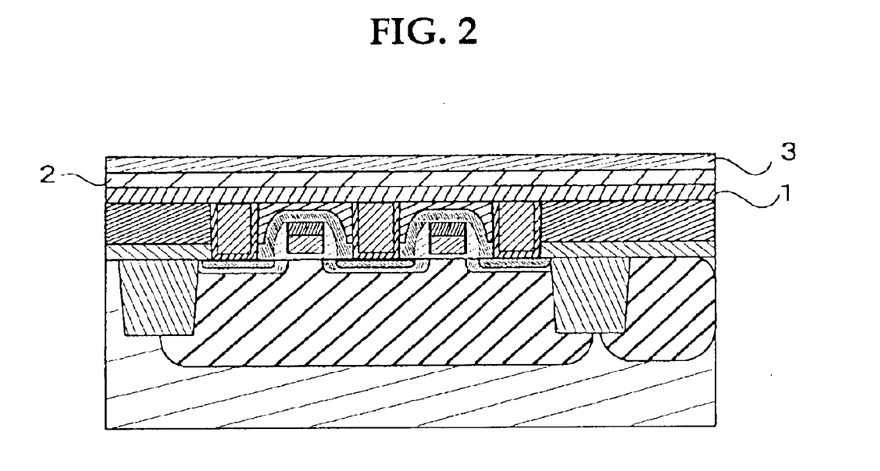
FIG. 2 is a schematic explanatory view of a process for manufacturing a ferroelectric memory according to the present invention, showing an example of a state after forming the ferroelectric capacitor according to the present invention.

Next, as shown in FIG. 2, one of a pair of electrodes 1 is formed of Ir by sputtering and is heated to 400° C. to 700° C. On the heated one of a pair of electrodes, a PZT layer 2 is formed by the MOCVD method. Here, for forming the PZT layer 2, a mixture of an organic metal and an oxidizing gas is used as a raw material gas. The mixture gas is sprayed onto the one of a pair of electrodes, upon which the organic metal is thermally decomposed and disposed on the one of a pair of electrodes layer to form a ferroelectric layer comprising PZT. The ferroelectric layer is subjected to a first heat treatment. Subsequently, the other electrode layer 3 of IrOx is formed on the ferroelectric layer. Thereby, a ferroelectric capacitor (three-layer structure) is formed. Furthermore, the resulting ferroelectric capacitor is subjected to a second heat treatment, if the first heat treatment is not carried out.

Figure 3:
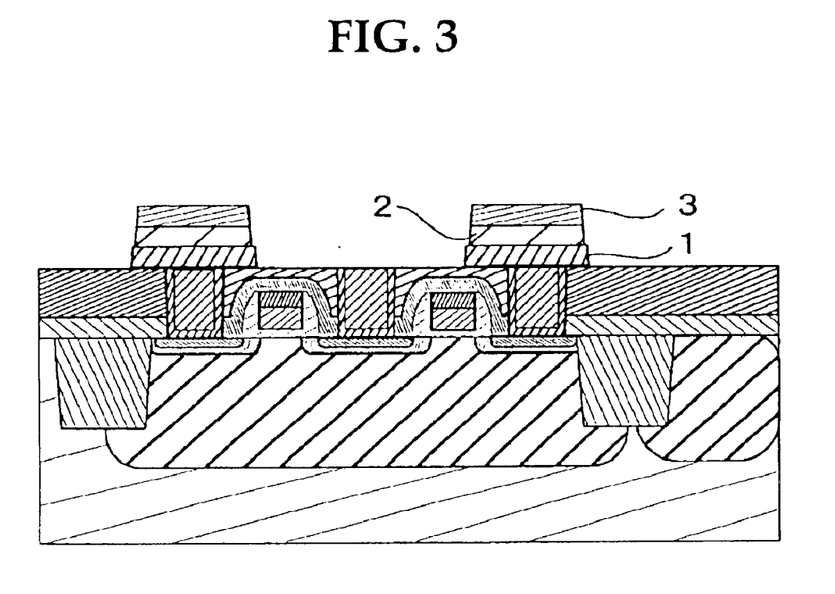
FIG. 3 is a schematic explanatory view of a process for manufacturing a ferroelectric memory according to the present invention, showing an example of a state after a ferroelectric capacitor according to the present invention is etched.

Then, as shown in FIG. 3, the ferroelectric capacitor is etched to form a ferroelectric capacitor of a stack type with a flat structure.

Figure 4:
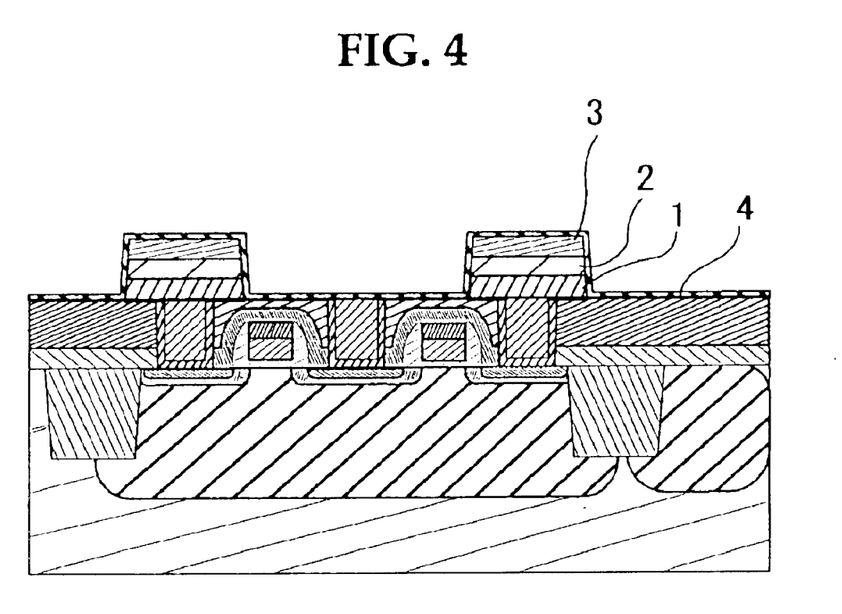
FIG. 4 is a schematic explanatory view of a process for manufacturing a ferroelectric memory according to the present invention, showing an example of a state after forming a protecting layer on the surface of a ferroelectric capacitor according to the present invention.

Next, as shown in FIG. 4, a protecting layer 4 (for example, a PZT layer) is formed on the surface of the ferroelectric capacitor.

Figure 5:
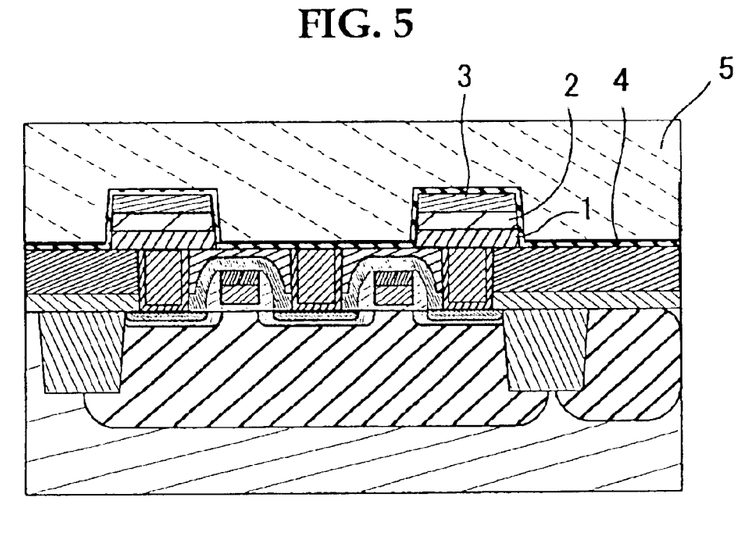
FIG. 5 is a schematic explanatory view of a process for manufacturing a ferroelectric memory according to the present invention, showing an example of a state after forming an interlayer insulating layer on the protecting layer formed on the surface of a ferroelectric capacitor according to the present invention.
Figure 6:
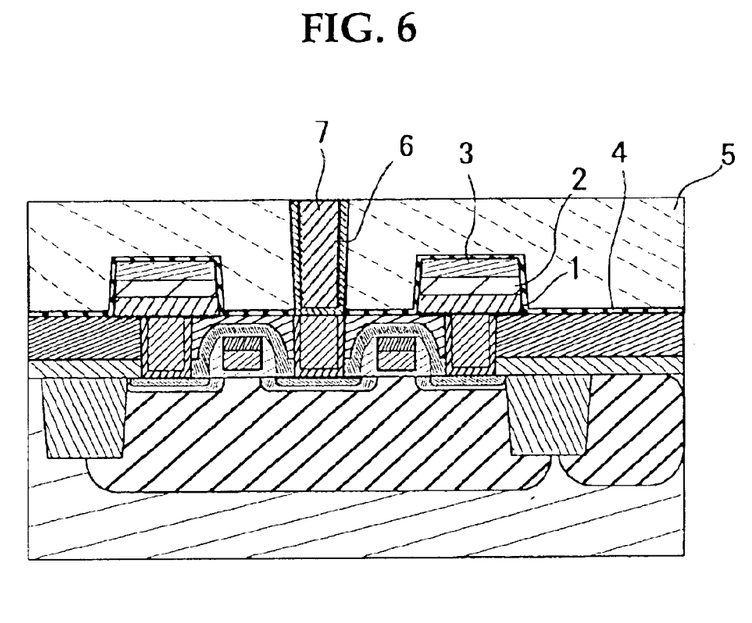
FIG. 6 is a schematic explanatory view of a process for manufacturing a ferroelectric memory according to the present invention, showing an example of a state after forming a plug on the interlayer insulating layer on the surface of the ferroelectric capacitor according to the present invention.
Figure 7:
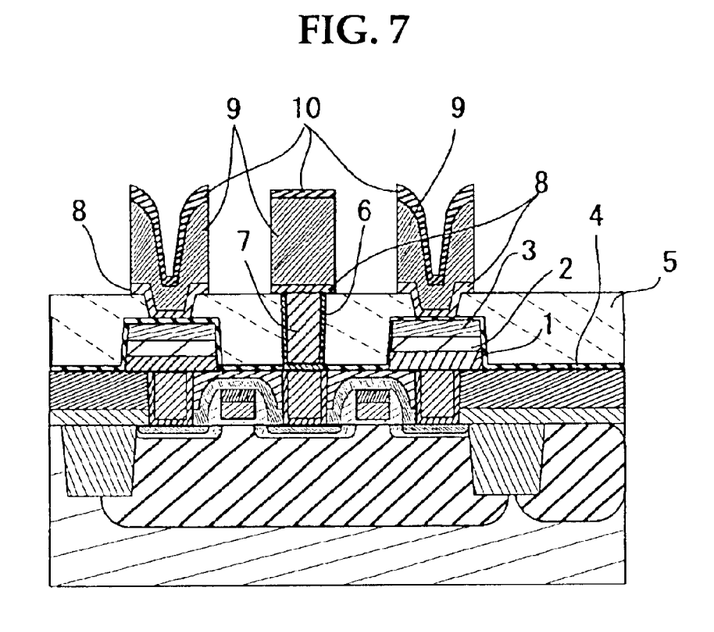
FIG. 7 is a schematic explanatory view of a process for manufacturing a ferroelectric memory according to the present invention, showing an example of a state after forming a plug and lines on the interlayer insulating layer on the ferroelectric capacitor according to the present invention.

As shown in FIG. 5, an interlayer insulating layer 5 is formed on the protecting layer 4 and leveled by the CMP process. Then, as shown in FIG. 6, an opening for a plug contact part is formed on the interlayer insulating layer 5 and a TiN/Ti layer 6 and a W layer 7 are laminated in this order. These layers are leveled by the CMP process to form a plug. As shown in FIG. 7, to form wiring layers, a TiN/Ti layer 8, Al layer 9 (or Al—Cu layer), and Ti/TiN layer 10 are laminated in this order. Thereafter, patterning and etching are carried out. Then, the process for forming an interlayer insulating layer, the CMP process, the process for opening a plug part, the process for forming a plug, the process for forming wiring layers, the process for patterning the wiring layers and the process for etching the wiring layers are repeated in this order to form a multi-layer structure.

By this way, a ferroelectric memory (Ferroelectric Random Access Memory) comprising a ferroelectric capacitor according to the present invention is formed.

The ferroelectric memory according to the present invention can be suitably applied in various semiconductor devices.

Now, the present invention will be explained by the following examples, but is not limited those examples.

EXAMPLE 1

A ferroelectric memory was prepared as follows.

First of all, one of a pair of electrodes of Ir was deposited by the sputtering method on a Si substrate having $SiO_2$ film formed. Here, the one of a pair of electrodes of Ir had a thickness of 150 nm.

Then, a PZT layer was formed by the MOCVD method on the one of a pair of electrodes. Specifically, the PZT layer was formed at a temperature of 580° C. using 0.32 ml/min of $Pb(DPM)_2$ as a Pb material, 0.2 ml/min of $Zr(dmhd)_4$ as a Zr material, 0.2 ml/min of $Ti(O\text{-}iPr)_2(DPM)_2$ as a Ti material at an oxygen partial pressure of 5 Torr (666 Pa). The PZT raw materials were dissolved in tetrahydrofuran (THF) at a concentration of 3% of a molar ratio, and the resulting solution was transported to an evaporator. In the evaporator which had been brought to 260° C., the solution (THF and the raw materials) was evaporated and mixed with oxygen to obtain a raw gas. The raw gas was then deposited through a shower head on the one of a pair of electrodes. Forming the PZT layer took 420 seconds. The resulting PZT layer had a thickness of 120 nm and its composition was Pb/(Zr+Ti)= 1.15 and Zr·(Zr+Ti)=0.45.

After being formed, the PZT layer was subjected to a heat treatment at 650° C. under low pressure with a oxygen partial pressure of 1 Torr (133 Pa) for 1 minute.

The amount of carbon and hydrogen in the PZT layer before and after the heat treatment were examined and compared according to a SIMS analysis. The results are shown in FIG. 8 (comparison of carbon concentration) and FIG. 9 (comparison of hydrogen concentration).

Figure 8:
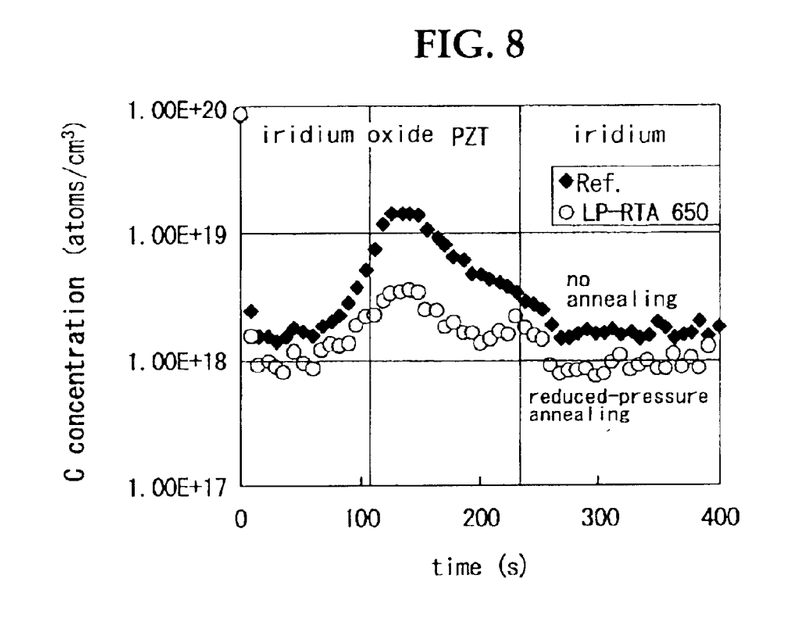
FIG. 8 is a graph showing an example of a comparison of the carbon concentration in a PZT layer which has been subjected or has not been subjected to a heat treatment, after forming the PZT layer as a ferroelectric.
Figure 9:
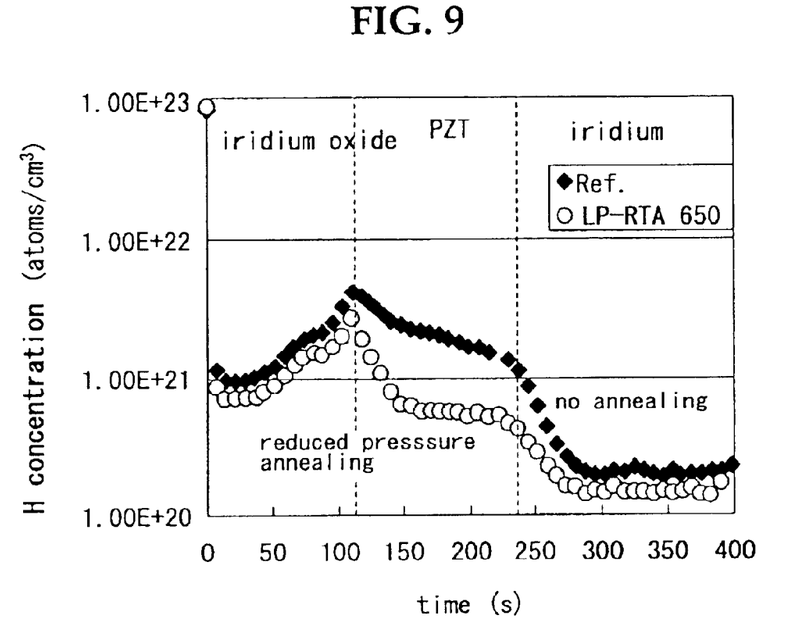
FIG. 9 is a graph showing an example of a comparison of the hydrogen concentration in a PZT layer which has been subjected or not been subjected to a heat treatment after forming of the PZT layer as a ferroelectric layer.

As shown in FIG. 8, the amount of residual carbon in the PZT layer was $5\times10^{18}$ atoms/$cm^3$, which indicates that the amount of carbon was reduced to a half or less of the amount before the treatment. Also, as shown in FIG. 9, the amount of residual hydrogen in the PZT layer was $3\times10^{21}$ atoms/$cm^3$, which indicates that the amount of hydrogen was reduced to a half or less of the amount before the treatment. Further, upon examining the profile configuration, it was assumed that carbon atoms were diffused at both of the sides of one of a pair of electrodes and the other electrode while hydrogen atoms were not diffused in the one of a pair of electrodes but were distributed with a gradient of the concentration toward the surface (upper side).

Next, iridium oxide was deposited (formed by laminating) so as to have a thickness of 200 nm on the PZT layer by reactive sputtering. In this way, a ferroelectric capacitor according to the present invention was formed. Furthermore, a ferroelectric memory according to the present invention was prepared by carrying out a general process for producing a ferroelectric memory (processing, interlayer, metal wiring, and the like.)

Figure 10:
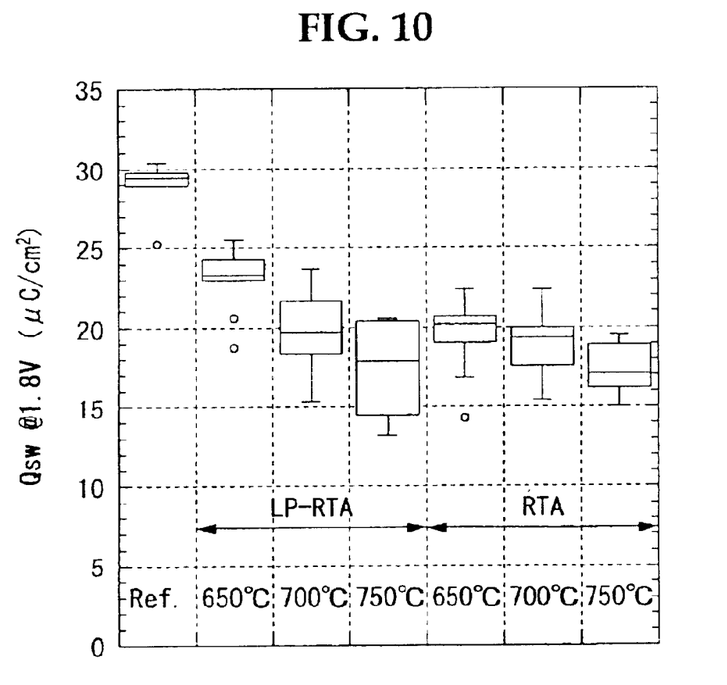
FIG. 10 is a graph showing an example of a comparison between a switching charge after forming the other electrode and the heat treatment conditions.

The ferroelectric capacitor thus obtained was examined for its electric property and the results are shown in FIG. 10, in which the vertical axis is a switching charge of the ferroelectric capacitor. This figure shows each of the results of the conventional methods that do not take the heat treatment, and other cases that take the heating treatment at conditions of various temperatures.

The electric property of ferroelectric capacitor prepared by a conventional method ("Ref" in FIG. 10) was 29 $\mu C/cm^2$. On the other hand, the electric property of the ferroelectric capacitor prepared in Example 1 ("650" in FIG. 10), that is, the ferroelectric capacitor heat-treated (a low pressure RTA, 650° C.) was 23 $\mu C/cm^2$.

However, after repeating $2.2\times10^9$ times of rewriting, it was found that the standard switching charge of the ferroelectric capacitor prepared by a conventional method ("a conventional method" in FIG. 11) had been reduced by 10% while the standard switching charge of the ferroelectric capacitor prepared in Example 1 ("LP-RTA650" in FIG. 11), that is, the ferroelectric capacitor heat-treated (a low pressure RTA, 650° C.) had been reduced by only 1.7% (Table 1). Therefore, it was noted that the ferroelectric capacitor of Example 1 is excellent in fatigue properties compared to the ferroelectric capacitor prepared by a conventional method.

Figure 11:
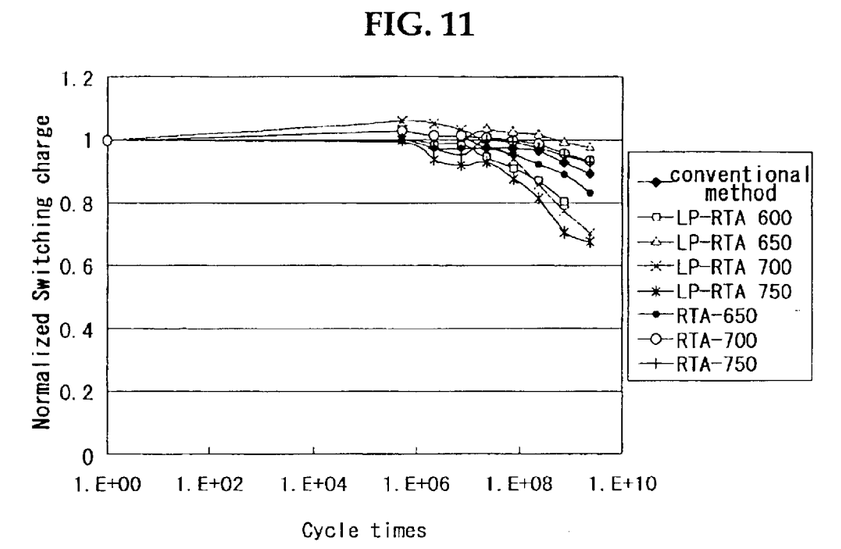
FIG. 11 is a graph showing an example of a comparison between fatigue properties (rewriting times: 1.8V, $2.2 \times 10^9$ times) after forming the other electrode, and the heat treatment conditions.

FIG. 11 shows the results of the experiment examining the relationship between a heat treatment under low pressure and electric properties of a ferroelectric capacitor obtained. The figure additionally shows the results of the experiment evaluating the relationship between a heat treatment under atmospheric pressure and electric properties of a ferroelectric capacitor obtained. In FIG. 11, "LP" represents a low pressure, that is a reduced-pressure and numbers such as "650" represent temperatures such as "650° C."

According to the results shown in FIG. 11, the ferroelectric capacitor heat-treated (low-pressure RTA, 600° C.) did not show any improvement in its properties. This is believed to be because when the heat treatment was performed at a temperature almost equal to 580° C. at which the PZT layer had been deposited, carbon and hydrogen were not sufficiently released from the PZT layer. Also, the ferroelectric capacitor heat-treated (low-pressure RTA) at 700° C. or 750° C. showed a tendency of deteriorated fatigue properties. This is believed to be because an amount of Pb is reduced by the heat treatment. By controlling the amount of Pb, such deterioration of fatigue properties could not be observed.

Also, according to the results shown in FIG. 11, the ferroelectric capacitor heat-treated (atmospheric pressure RTA) showed the same results with the ferroelectric capacitor heat-treated (low-pressure RTA). At this time, the temperature condition at which improvement in fatigue properties was observed was slightly shifted to a high temperature, compared to the heat treatment under a low pressure condition.

Figure 12:
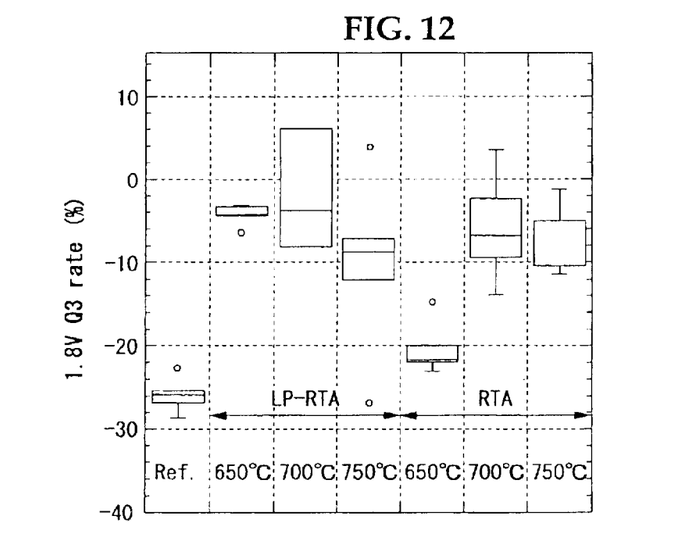
FIG. 12 is a graph showing a comparison between the imprint properties after 88 hours at 1.8 V, and the heat treatment conditions.

Next, in FIG. 12, there are shown the results of the comparison between imprint properties of the ferroelectric capacitor prepared by a conventional method and the ferroelectric capacitor prepared in Example 1. The ferroelectric capacitor prepared by a conventional method showed an imprint rate of −26%, as determined by the shift for 88 hours shift, while the ferroelectric capacitor prepared in Example 1 showed −4.4%. Thus, it was demonstrated that the imprint properties were improved by the present invention.

From the above, it was found that the ferroelectric capacitor prepared in Example 1 and the ferroelectric memory comprising the ferroelectric capacitor, in which the PZT layer, as a ferroelectric layer, deposited by the MOCVD method has been subjected to a heat treatment, have a reduced amount of carbon and hydrogen in the PZT layer. In this way, they are excellent in fatigue properties and imprint properties.

EXAMPLE 2

A ferroelectric memory was prepared as follows.

First of all, one of a pair of electrodes of Ir was formed and deposited by the sputtering method on a Si substrate having $SiO_2$ film. Here, the one of a pair of electrodes of Ir had a thickness of 150 nm.

Then, a PZT layer was formed by the MOCVD method on the one of a pair of electrodes. Specifically, the PZT layer was formed at a temperature of 580° C. to 620° C. using 0.23 ml/min of $Pb(METHD)_2$ as a Pb material, 0.4 ml/min of $Zr(METHD)_4$ as a Zr material, 0.17 ml/min of $Ti(MPD)(METHD)_2$ as a Ti material at an oxygen partial pressure of 2.5 Torr (333 Pa). The PZT raw materials were dissolved in ethylcyclohexane at a concentration of 3% at a molar ratio, and the resulting solution was transported to an evaporator. In the evaporator which had been brought to 260° C., the solution (ethylcyclohexane and the raw materials) was evaporated and mixed with oxygen to obtain a raw gas. The raw gas was then deposited through a shower head on the one of a pair of electrodes. Forming the PZT layer took 580 seconds. The resulting PZT layer had a thickness of 120 nm and its composition was Pb/(Zr+Ti)=1.15 and Zr·(Zr+Ti)= 0.44.

Thereafter, SRO (100 nm)/IrOx (100 nm) was deposited (formed by laminated) on the PZT layer by reactive sputtering. In this way, the formation of a ferroelectric capacitor according to the present invention was completed. The ferroelectric capacitor was etched and subjected to a heat treatment at 700° C. for 1 hour. Furthermore, a ferroelectric memory according to the present invention was manufactured by carrying out a general process for manufacturing a ferroelectric memory (processing, interlayer, metal wiring, and the like).

The ferroelectric capacitor prepared in Example 2 was examined for its electric property and the results are almost same as the ferroelectric capacitor prepared in Example 1. It found that the ferroelectric capacitor prepared in Example 2 and the ferroelectric memory comprising the ferroelectric capacitor, in which the PZT layer, as a ferroelectric layer, deposited by the MOCVD method has been subjected to a heat treatment, have reduced the amount of carbon and hydrogen in the PZT layer, thereby being excellent in fatigue properties and imprint properties.

TABLE 1

| Preparation | fatigue loss % |
| --- | --- |
| Conventional Method | 10.5% |
| Low-pressure RTA 600° C. | 19% (*) |
| Low pressure RTA 650° C. | 1.7% |
| Low pressure RTA 700° C. | 30% |
| Low pressure RTA 750° C. | 32% |
| Atmospheric pressure RTA 650° C. | 17.3% |
| Atmospheric pressure RTA 700° C. | 7.9% |
| Atmospheric pressure RTA 750° C. | 5.5% (*) |

Table 1 shows the fatigue properties according to each RTA conditions of temperature (depolarization ratio values when the rewriting was repeated $2.2 \times 10^9$ times with 8V), after forming a PZT layer as the ferroelectrics layer. (wherein, (*) means the data obtained after $7.2 \times 10^8$ times).

According to the present invention, it is possible to solve problems involved in the related arts and to provide a high-quality ferroelectric capacitor which is excellent in fatigue properties, imprint properties as well as an effective method for manufacturing the ferroelectric capacitor, and a high-quality ferroelectric memory comprising the ferroelectric capacitor.

What is claimed is:

1. A ferroelectric capacitor comprising:

a ferroelectric layer, being formed by a MOCVD (Metal Organic Chemical Vapor Deposition) method, and a pair of electrodes contacting with the ferroelectric layer, wherein the ferroelectric layer has carbon atoms of $5 \times 10^{18}$ $cm^{-3}$ or less.

2. The ferroelectric capacitor according to claim 1, wherein at least one of the pair of electrodes comprises Ir, and the other electrode comprises one of Ir and Ir oxide.

3. The ferroelectric capacitor according to claim 1, wherein a hydrogen concentration of the ferroelectric layer is $3 \times 10^{21}$ $cm^{-3}$ or less.

4. The ferroelectric capacitor according to claim 1, wherein the ferroelectric layer is formed of one of $Pb(Zr_x, Ti_{1-x})O_3$ ($0 < x \leq 1$) and $PbTiO_3$, and the ferroelectric capacitor has one of a single-layer structure and a multi-layer structure.

5. The ferroelectric capacitor according to claim 1, wherein at least one of the pair of electrodes includes carbon atoms as diffused impurities from the ferroelectric layer.

6. A ferroelectric capacitor comprising:

a ferroelectric layer, being formed by a MOCVD (Metal Organic Chemical Vapor Deposition) method, and a pair of electrodes contacting with the ferroelectric layer, wherein the ferroelectric layer has carbon atoms, wherein at least one of the pair of electrodes includes carbon atoms as diffused impurities from the ferroelectric layer.

7. The ferroelectric capacitor according to claim 6, wherein at least one of the pair of the electrodes comprises Ir, and the other electrode comprises one of Ir and Ir oxide.

8. The ferroelectric capacitor according to claim 6, wherein a hydrogen concentration of the ferroelectric layer is $3 \times 10^{21}$ cm$^{-3}$ or less.

9. The ferroelectric capacitor according to claim 6, wherein the ferroelectric layer is formed of one of Pb(Zr$_x$, Ti$_{1-x}$)O$_3$ ($0 < x \leq 1$) and PbTiO$_3$, and the ferroelectric capacitor has one of a single-layer structure and a multi-layer structure.

10. A ferroelectric memory comprising a ferroelectric capacitor, wherein the ferroelectric capacitor comprises:

a ferroelectric layer, being formed by a MOCVD (Metal Organic Chemical Vapor Deposition) method, and a pair of electrodes contacting with the ferroelectric layer, wherein the ferroelectric layer has carbon atoms of $5 \times 10^{18}$ cm$^{-3}$ or less.

11. A ferroelectric memory comprising: a ferroelectric capacitor, wherein the ferroelectric capacitor comprises:

a ferroelectric layer, being formed by a MOCVD (Metal Organic Chemical Vapor Deposition) method, and a pair of electrodes contacting with the ferroelectric layer;

wherein the ferroelectric layer has carbon atoms, and wherein at least one of the pair of electrodes includes carbon atoms as diffused impurities from the ferroelectric layer.

* * * * *

UNITED STATES PATENT AND TRADEMARK OFFICE
CERTIFICATE OF CORRECTION

PATENT NO. : 6,812,510 B2
DATED : November 2, 2004
INVENTOR(S) : Yoshimasa Horii et al.

It is certified that error appears in the above-identified patent and that said Letters Patent is hereby corrected as shown below:

<u>Title page,</u>
Item [75], Inventors, change "Katsuyoshi Matsuura, Kawaskai (JP);" to -- Katsuyoshi Matsuura, Kawasaki (JP); --

Signed and Sealed this

Nineteenth Day of April, 2005

JON W. DUDAS
*Director of the United States Patent and Trademark Office*